United States Patent
Mizoguchi

(10) Patent No.: US 9,178,482 B2
(45) Date of Patent: Nov. 3, 2015

(54) FILTER ELEMENT

(71) Applicant: Murata Manufacturing Co., Ltd., Nagaokakyo-shi, Kyoto-fu (JP)

(72) Inventor: Naoki Mizoguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 314 days.

(21) Appl. No.: 13/848,072

(22) Filed: Mar. 21, 2013

(65) Prior Publication Data

US 2013/0249646 A1  Sep. 26, 2013

(30) Foreign Application Priority Data

Mar. 23, 2012  (JP) ................................ 2012-066484

(51) Int. Cl.
*H03H 7/09* (2006.01)
*H03H 7/01* (2006.01)
*H03H 1/00* (2006.01)

(52) U.S. Cl.
CPC ............... *H03H 7/0115* (2013.01); *H03H 7/09* (2013.01); *H03H 2001/0085* (2013.01)

(58) Field of Classification Search
CPC  H03H 2001/0085; H03H 7/09; H03H 7/0115
USPC ................................................. 333/185, 175
See application file for complete search history.

(56) References Cited

U.S. PATENT DOCUMENTS

| | | | | |
|---|---|---|---|---|
| 2007/0241839 | A1* | 10/2007 | Taniguchi | 333/185 |
| 2011/0140806 | A1 | 6/2011 | Taniguchi | |
| 2011/0169586 | A1 | 7/2011 | Taniguchi | |
| 2012/0032758 | A1* | 2/2012 | Mori et al. | 333/185 |
| 2012/0098622 | A1 | 4/2012 | Taniguchi | |
| 2012/0098623 | A1 | 4/2012 | Taniguchi | |
| 2013/0009726 | A1* | 1/2013 | Sasaki | 333/185 |

FOREIGN PATENT DOCUMENTS

| | | |
|---|---|---|
| JP | 05-167374 A | 7/1993 |
| JP | 11-097963 A | 4/1999 |
| JP | 2005-045447 A | 2/2005 |
| JP | 2011-124880 A | 6/2011 |
| JP | 2012-109949 A | 6/2012 |
| JP | 2012-109950 A | 6/2012 |
| WO | 2010/055725 A1 | 5/2010 |

* cited by examiner

*Primary Examiner* — Robert Pascal
*Assistant Examiner* — Rakesh Patel
(74) *Attorney, Agent, or Firm* — Keating & Bennett, LLP

(57) ABSTRACT

A filter element includes a laminate including insulator layers. A ring conductor pattern is provided on one of the insulator layers. Linear conductor patterns of a first inductor having a helical shape with an axial direction thereof being a laminating direction of the laminate and linear conductor patterns of a second inductor having a helical shape with an axial direction thereof being the laminating direction are provided on predetermined ones of the insulator layers. The ring conductor pattern is arranged such that inner regions of the linear conductor patterns of the first inductor and inner regions of the linear conductor patterns of the second inductor are included in an inner region of the ring conductor pattern.

20 Claims, 9 Drawing Sheets

FILTER ELEMENT

BACKGROUND OF THE INVENTION

1. Field of the Invention

The present invention relates to a filter element including an inductor.

2. Description of the Related Art

Currently, various filter elements are used as high-frequency components for use in communication modules. One of those filter elements is an LC filter element including an inductor and a capacitor.

As disclosed in Japanese Unexamined Patent Application Publication No. 11-97963, for example, the above-mentioned type of filter element is configured using a laminate in which an inductor and a capacitor are defined by internal conductors.

The LC filter element disclosed in Japanese Unexamined Patent Application Publication No. 11-97963 includes two parallel resonators each including an inductor and a capacitor. Respective inductors of the parallel resonators are magnetically coupled with each other through a mutual inductance. A desired filter characteristic is achieved by utilizing the magnetic coupling.

To obtain the above-mentioned magnetic coupling, in Japanese Unexamined Patent Application Publication No. 11-97963, linear conductor patterns for the respective inductors of the parallel resonators are formed in different layers of the laminate. Furthermore, the linear conductor patterns for the inductors are arranged in an overlapping relationship when viewed in the laminating direction of the laminate, while an insulator layer having a properly adjusted thickness and arranged to adjust the mutual inductance is interposed between the linear conductor patterns.

However, with the arrangement disclosed in Japanese Unexamined Patent Application Publication No. 11-97963, because the desired magnetic coupling is obtained by changing the thickness of the insulator layer for the adjustment of the mutual inductance, an achievable range of the magnetic coupling (i.e., an available range of the mutual inductance) is restricted by dimensional limitations of the laminate. This causes a problem, for example, in that the desired filter characteristic may not be obtained depending on the dimensions of the laminate. Moreover, a degree of flexibility in design of the filter characteristic is reduced.

SUMMARY OF THE INVENTION

Preferred embodiments of the present invention provide a filter element which is less affected by dimensional limitations of a laminate and which can more easily achieve a desired filter characteristic.

A filter element according to a preferred embodiment of the present invention includes a laminate including a plurality of insulator layers that are laminated to one another, and the laminate includes a first inductor and a second inductor therein.

The first inductor and the second inductor are each preferably defined by loop-shaped linear conductor patterns disposed between adjacent pairs of the plurality of insulator layers, and by via conductors penetrating through the insulator layers and connecting the linear conductor patterns to each other in a laminating direction of the laminate, each of the first inductor and the second inductor preferably having a helical or substantially helical shape and including an air space portion with a center axis extending in the laminating direction. The first inductor and the second inductor are disposed at different positions of the laminate when viewed in the laminating direction.

The filter element according to a preferred embodiment of the present invention preferably further includes a ring conductor pattern having the following features. The ring conductor pattern includes an opening and is provided on an insulator layer different from the insulator layers on which the first inductor and the second inductor are provided. Moreover, the ring conductor pattern is arranged such that at least a portion of the air space portion of the first inductor and at least a portion of the air space portion of the second inductor are arranged inside the ring conductor pattern when viewed in the laminating direction.

With such an arrangement, magnetic coupling (M coupling) generating a mutual inductance between the first inductor and the second inductor is provided by not only direct magnetic coupling (M coupling) between the linear conductor patterns of the first inductor and the linear conductor patterns of the second inductor, but also magnetic coupling (M coupling) through the ring conductor pattern. A degree of coupling between each of the first inductor and the second inductor and the ring conductor pattern can be adjusted depending upon a shape of the ring conductor pattern and a positional relationship of the ring conductor pattern with respect to the linear conductor patterns of the first inductor and the linear conductor patterns of the second inductor. As a result, the M coupling can be adjusted without changing a thickness of the laminate, and a degree of flexibility in design of a filter characteristic is significantly increased without being affected by dimensional limitations of the laminate.

In the filter element according to a preferred embodiment of the present invention, the ring conductor pattern preferably has a shape such that the air space portion of the first inductor and the air space portion of the second inductor are arranged inside the opening of the ring conductor pattern when viewed in the laminating direction.

With such an arrangement, the magnetic coupling between both the first inductor and the second inductor and the ring conductor pattern can be increased.

In the filter element according to a preferred embodiment of the present invention, the ring conductor pattern may preferably be arranged to overlap with at least a portion of the linear conductor patterns of the first inductor and with at least a portion of the linear conductor patterns of the second inductor when viewed in the laminating direction.

With such an arrangement, the magnetic coupling between both the first inductor and the second inductor and the ring conductor pattern can be further increased.

In the filter element according to a preferred embodiment of the present invention, the ring conductor pattern may preferably have a shape extending, in an overlapping relationship, along the linear conductor pattern of at least the insulator layer of the first inductor, which insulator layer is positioned closest to the ring conductor pattern, and along the linear conductor pattern of at least the insulator layer of the second inductor, which insulator layer is positioned closest to the ring conductor pattern, when viewed in the laminating direction.

With such an arrangement, the magnetic coupling between both the first inductor and the second inductor and the ring conductor pattern can be further increased.

Moreover, in the filter element according to a preferred embodiment of the present invention, the ring conductor pattern may preferably be configured as follows. The ring conductor pattern includes a first open ring-shaped portion and a second open ring-shaped portion that are surface-symmetric with respect to an imaginary plane, the imaginary plane being perpendicular or substantially perpendicular to a flat plate surface of the insulator layer and being set such that the air space portion of the first inductor and the air space portion of the second inductor are surface-symmetric with respect to the imaginary plane. The ring conductor pattern is preferably configured such that, when viewed in the laminating direction, a center axis of the air space portion of the first inductor and a center of the first open ring-shaped portion are aligned or substantially aligned with each other, and a center axis of the air space portion of the second inductor and a center of the second open ring-shape portioned are aligned or substantially aligned with each other.

With such an arrangement, the ring conductor pattern is arranged such that the magnetic coupling between the first inductor and the ring conductor pattern can be increased and the magnetic coupling between the second inductor and the ring conductor pattern can also be increased.

In the filter element according to a preferred embodiment of the present invention, the ring conductor pattern preferably has a length equal or substantially equal to a wavelength of attenuation pole frequency that is desired as the filter element, for example.

With such a feature, an attenuation pole can be provided at a desired frequency of the filter characteristic without separately providing a resonance circuit pattern to set the attenuation pole.

In the filter element according to a preferred embodiment of the present invention, the ring conductor pattern may preferably not be connected to other circuit elements of the filter element and to a ground.

Such an arrangement represents an example of a practical shape of the ring conductor pattern.

In addition, the filter element according to a preferred embodiment of the present invention is preferably configured as follows. The filter element further includes a first capacitor defined by a set of first flat plate conductors opposed to each other with a predetermined area, the first flat plate conductors being provided on the insulator layers different from the insulator layers on which the linear conductor patterns of the first inductor, the linear conductor patterns of the second inductor, and the ring conductor pattern are provided, and a second capacitor defined by a set of second flat plate conductors opposed to each other with a predetermined area, the second flat plate conductors being provided on the insulator layers different from the insulator layers on which the linear conductor patterns of the first inductor, the linear conductor patterns of the second inductor, and the ring conductor pattern are provided. The first inductor and the first capacitor define a first parallel resonator, and the second inductor and the second capacitor define a second parallel resonator.

With such a configuration, a band pass filter can be provided by using the first parallel resonator and the second parallel resonator. Moreover, a band pass filter that is less affected by the dimensional limitations of the laminate and that is capable of providing a desired band pass characteristic can be achieved because the band pass filter includes the ring conductor pattern that is configured as described above.

According to various preferred embodiments of the present invention, a filter element can be obtained which is less affected by the dimensional limitations of the laminate, and which can achieve the desired filter characteristic with higher reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A filter element according to preferred embodiments of the present invention will be described below with reference to the drawings. While the present preferred embodiment is described in connection with a band pass filter as an example, the arrangement of the present preferred embodiment can similarly be applied to any type of filter utilizing a mutual inductance that is obtained with magnetic coupling between plural inductors.

Figure 1:
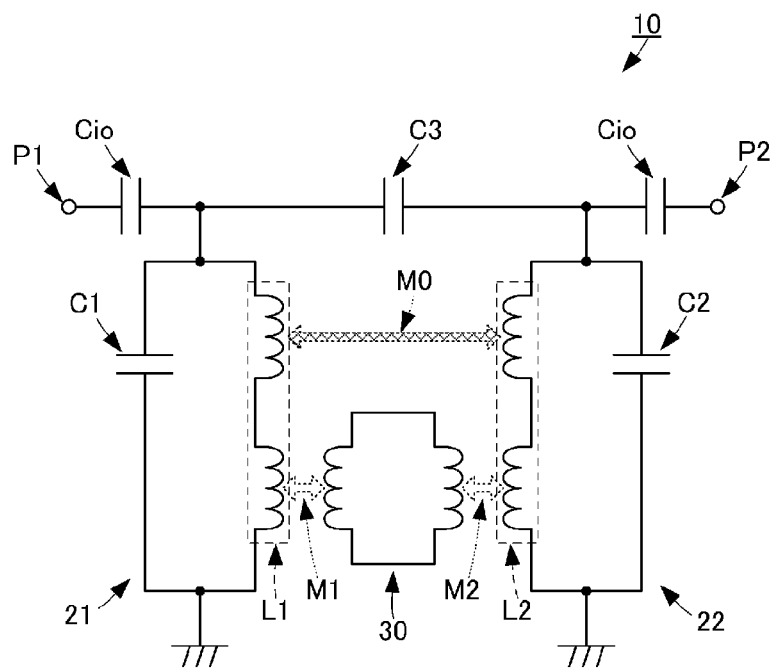
FIG. 1 is an equivalent circuit diagram of a filter element according to an example of a preferred embodiment of the present invention.

FIG. 1 is an equivalent circuit diagram of a filter element according to the present preferred embodiment of the present invention.

The filter element 10 includes a first input/output terminal P1 and a second input/output terminal P2. A capacitor C3 is connected between the first input/output terminal P1 and the second input/output terminal P2. A terminal of the capacitor C3 disposed on the same side as the first input/output terminal P1 is connected to the ground through a first parallel resonator 21. A terminal of the capacitor C3 disposed on the same side as the second input/output terminal P2 is connected to the ground through a second parallel resonator 22. An input/output capacitor Cio is connected between the first parallel resonator on the side connected to the capacitor C3 and the first input/output terminal P1 and between the second parallel resonator 22 on the side connected to the capacitor C3 and the second input/output terminal P2.

The first parallel resonator 21 includes a first inductor L1 and a first capacitor C1. The second parallel resonator 22 includes a second inductor L2 and a second capacitor C2. The first inductor L1 of the first parallel resonator 21 and the second inductor L2 of the second parallel resonator 22 are magnetically coupled with each other, and they generate a mutual inductance M0.

The filter element 10 further includes a ring resonator 30. The ring resonator 30 and the first inductor L1 of the first parallel resonator 21 are magnetically coupled with each other and generate a mutual inductance M1. The ring resonator 30 and the second inductor L2 of the second parallel resonator 22 are magnetically coupled with each other and generate a mutual inductance M2.

With the circuit configuration described above, the filter element 10 functions as a band pass filter.

Figure 2:
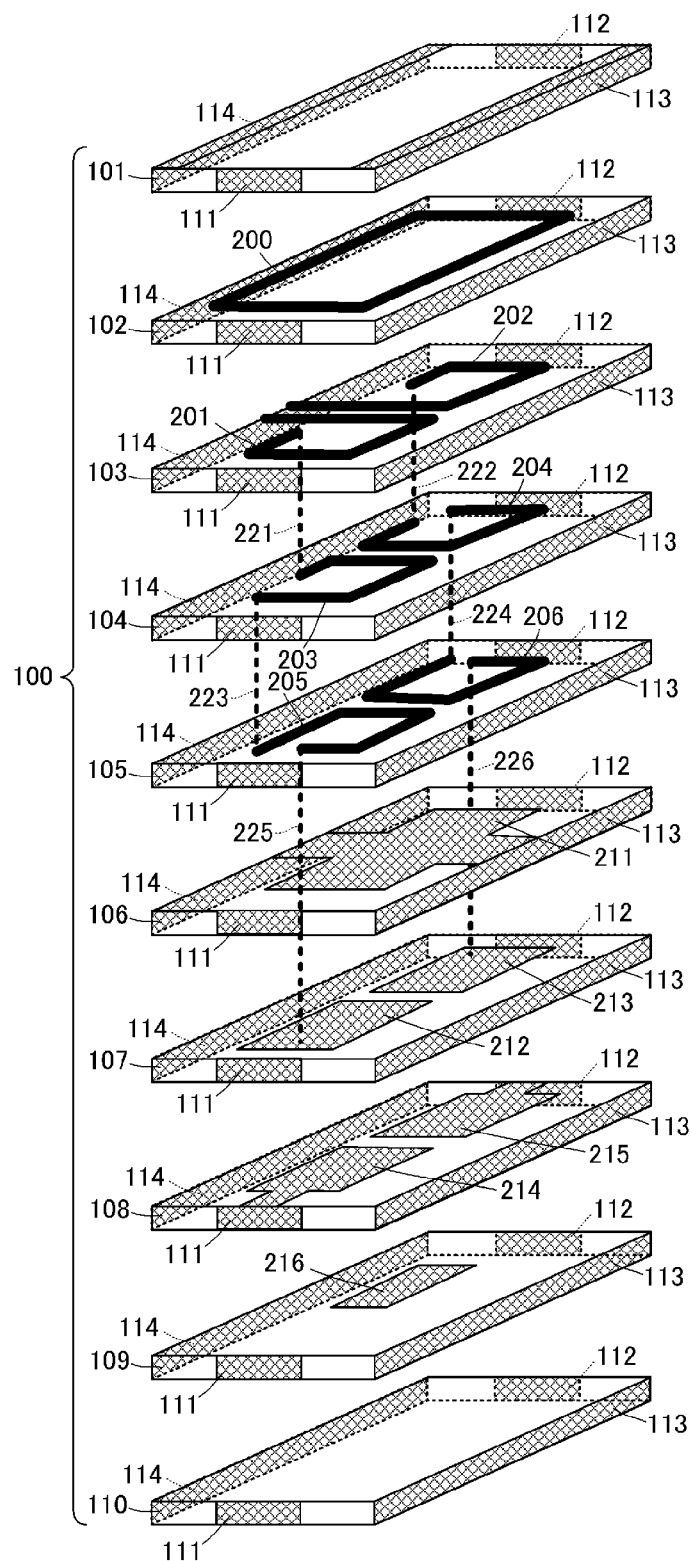
FIG. 2 is an exploded perspective view of a laminate defining the filter element according to the first preferred embodiment of the present invention.

FIG. 2 is an exploded perspective view of a laminate 100 defining the filter element 10 according to the present preferred embodiment.

The filter element 10 includes the laminate 100 that includes a plurality (for example, ten in the present preferred embodiment) of insulator layers 101 to 110 that are laminated to each other. The insulator layers 101 to 110 are flat plates having the same or substantially the same shape and are laminated such that those flat plates are successively overlaid one above another. It is to be noted that the number of insulator layers illustrated in the present preferred embodiment is one example and the laminate may include any predetermined number of insulator layers optionally selected depending on specifications. The following description is provided on the premise that a first direction of the insulator layers 101 to 110 is a direction parallel or substantially parallel to the lengthwise direction of a flat plate surface and a second direction of the insulator layers 101 to 110 is a direction parallel or substantially parallel to the widthwise direction of the flat plate surface.

A first terminal conductor 111, a second terminal conductor 112, a first ground conductor 113, and a second ground conductor 114 are provided on the insulator layer 101 that is an uppermost layer of the laminate 100. The first terminal conductor 111 is provided on the insulator layer 101 at one end surface (short lateral surface) thereof in the first direction. The second terminal conductor 112 is provided on the insulator layer 101 at the other end surface (short lateral surface) thereof in the first direction. The first ground conductor 113 is provided on the insulator layer 101 at one end surface (long lateral surface) thereof in the second direction. The second ground conductor 114 is provided on the insulator layer 101 at the other end surface (long lateral surface) thereof in the second direction. The first ground conductor 113 and the second ground conductor 114 are each arranged to extend over a predetermined area portion of a top surface of the insulator layer 101 (i.e., a top surface of the laminate 100).

The first terminal conductor 111, the second terminal conductor 112, the first ground conductor 113, and the second ground conductor 114 are provided not only on the insulator layer 101, but on all of the insulator layers 101 to 110 of the laminate 100. The first terminal conductor 111 corresponds to the first input/output terminal P1 (see FIG. 1), and the second terminal conductor 112 corresponds to the second input/output terminal P2 (see FIG. 1).

In the following description of the insulator layers from 102 to 110, the first terminal conductor 111, the second terminal conductor 112, the first ground conductor 113, and the second ground conductor 114 are omitted from the description.

The insulator layer 102 is arranged to underlie the insulator layer 101 in an adjacent relationship. A ring conductor pattern 200 is provided on a top surface of the insulator layer 102 (i.e., on a surface thereof on the side adjacent to the insulator layer 101). The ring conductor pattern 200 is a conductor preferably having a rectangular or substantially rectangular ring shape and including an opening of a predetermined area on the inner side thereof in a plan view of the insulator layer 102 (or the laminate 100) (i.e., when viewed in the laminating direction). The ring conductor pattern 200 is preferably the same or substantially the same length as a desired wavelength, for example. As a result, the ring conductor pattern 200 functions as a ring resonator. Accordingly, by providing the ring resonator while a length of the ring conductor pattern 200 is adjusted, it is possible to adjust a pass band width and to set an attenuation pole at a desired frequency in a filter characteristic described later.

The insulator layer 103 is arranged to underlie the insulator layer 102 in an adjacent relationship. Linear conductor patterns 201 and 202 are provided on a top surface of the insulator layer 103 (i.e., on a surface thereof on the side adjacent to the insulator layer 102). The linear conductor patterns 201 and 202 each preferably have an unclosed ring shape (hereinafter referred to as a "loop shape"), for example. The linear conductor patterns 201 and 202 are arranged with a predetermined spacing therebetween in the first direction.

Respective ends of the linear conductor patterns 201 and 202 are connected to the second ground conductor 114. The other end of the linear conductor pattern 201 is connected to a via conductor 221 that penetrates through the insulator layer 103. The other end of the linear conductor pattern 202 is connected to a via conductor 222 that penetrates through the insulator layer 103.

The insulator layer 104 is arranged to underlie the insulator layer 103 in an adjacent relationship. Linear conductor patterns 203 and 204 are provided on a top surface of the insulator layer 104 (i.e., on a surface thereof on the side adjacent to the insulator layer 103). The linear conductor patterns 203 and 204 each preferably have the loop shape. The linear conductor patterns 203 and 204 are arranged with a predetermined spacing therebetween in the first direction.

The linear conductor pattern 203 is preferably arranged in a shape corresponding or substantially corresponding to the linear conductor pattern 201 when viewing the laminate 100 in a plan view. In other words, the linear conductor pattern 203 is preferably configured such that an inner region surrounded by the linear conductor pattern 203 matches or substantially matches an inner region surrounded by the linear conductor pattern 201. One end of the linear conductor pattern 203 is connected to the via conductor 221. The other end of the linear conductor pattern 203 is connected to a via conductor 223 that penetrates through the insulator layer 104.

The linear conductor pattern 204 is preferably arranged in a shape corresponding or substantially corresponding to the linear conductor pattern 202 when viewing the laminate 100 in a plan view. In other words, the linear conductor pattern 204 is arranged such that an inner region surrounded by the linear conductor pattern 204 matches or substantially matches an inner region surrounded by the linear conductor pattern 202. One end of the linear conductor pattern 204 is connected to the via conductor 222. The other end of the linear conductor pattern 204 is connected to a via conductor 224 penetrating through the insulator layer 104.

The insulator layer 105 is arranged to underlie the insulator layer 104 in an adjacent relationship. Linear conductor patterns 205 and 206 are provided on a top surface of the insulator layer 105 (i.e., on a surface thereof on the side adjacent to the insulator layer 104). The linear conductor patterns 205 and 206 each have the loop shape. The linear conductor patterns 205 and 206 are arranged with a predetermined spacing therebetween in the first direction.

The linear conductor pattern 205 is preferably arranged in a shape corresponding or substantially corresponding to the linear conductor patterns 201 and 203 when viewing the laminate 100 in a plan view. In other words, the linear conductor pattern 205 is arranged such that an inner region surrounded by the linear conductor pattern 205 matches or substantially matches the inner region surrounded by each of the linear conductor patterns 201 and 203. One end of the linear conductor pattern 205 is connected to the via conductor 223. The other end of the linear conductor pattern 205 is connected to a via conductor 225 penetrating through the insulator layers 105 and 106.

The linear conductor pattern 206 is preferably arranged to correspond or substantially correspond to the linear conductor patterns 202 and 204 when viewing at the laminate 100 in a plan view. In other words, the linear conductor pattern 206 is arranged such that an inner region surrounded by the linear conductor pattern 206 matches or substantially matches the inner region surrounded by each of the linear conductor patterns 202 and 204. One end of the linear conductor pattern 206 is connected to the via conductor 224. The other end of the linear conductor pattern 206 is connected to a via conductor 226 penetrating through the insulator layers 105 and 106.

The first inductor L1 (see FIG. 1) includes the linear conductor patterns 201, 203 and 205 that are provided respectively on the insulator layers 103, 104 and 105, by the via conductors 221 and 223 each connecting adjacent two of those linear conductor patterns for continuity therebetween, and by the via conductor 225. Thus, the first inductor L1 preferably has a spiral (helical) shape including a center axis parallel or substantially parallel to the laminating direction.

The second inductor L2 (see FIG. 1) includes the linear conductor patterns 202, 204 and 206 that are provided respectively on the insulator layers 103, 104 and 105, by the via conductors 222 and 224 each connecting adjacent two of those linear conductor patterns for continuity therebetween, and by the via conductor 226. Thus, similarly to the first inductor L1, the second inductor L2, preferably has a spiral (helical) shape including a center axis that is parallel or substantially parallel to the laminating direction.

The insulator layer 106 is arranged to underlie the insulator layer 105 in an adjacent relationship. A flat plate conductor 211 is provided on a top surface of the insulator layer 106 (i.e., on a surface thereof on the side adjacent to the insulator layer 105). The term "flat plate conductor" implies a conductor pattern that has predetermined lengths in two perpendicular directions parallel or substantially parallel to a flat plate surface, rather than having a shape linearly extending in one direction like the linear conductor pattern.

The flat plate conductor 211 is preferably disposed substantially over an entire surface, including a central region, of the insulator layer 106 when viewing the insulator layer 106 in a plan view. However, the flat plate conductor 211 is disposed away from the via conductors 225 and 226. The flat plate conductor 211 is connected to the first ground conductor 113 and the second ground conductor 114.

The insulator layer 107 is arranged to underlie the insulator layer 106 in an adjacent relationship. Flat plates conductors 212 and 213 are provided on a top surface of the insulator layer 107 (i.e., on a surface thereof on the side adjacent to the insulator layer 106).

The flat plate conductors 212 and 213 are arranged with a predetermined spacing therebetween in the first direction.

The flat plate conductors 212 and 213 are each arranged in a shape having a predetermined area and opposed to the flat plate conductor 211. The flat plate conductor 212 is connected to the via conductor 225, and the flat plate conductor 213 is connected to the via conductor 226.

The insulator layer 108 is arranged to underlie the insulator layer 107 in an adjacent relationship. Flat plate conductors 214 and 215 are provided on a top surface of the insulator layer 108 (i.e., on a surface thereof on the side adjacent to the insulator layer 107).

The flat plate conductors 214 and 215 are arranged with a predetermined spacing therebetween in the first direction. The flat plate conductor 214 is preferably arranged to correspond or substantially correspond to the flat plate conductor 212 when viewing the laminate 100 in a plan view. The flat plate conductor 214 is connected to the first terminal conductor 111. The flat plate conductor 215 is arranged to correspond or substantially correspond with the flat plate conductor 213 when viewing the laminate 100 in a plan view. The flat plate conductor 215 is connected to the second terminal conductor 112.

The first capacitor C1 (see FIG. 1) includes the flat plate conductors 211 and 212 that are provided respectively on the insulator layers 106 and 107, and the insulator layer 106 interposed between the flat plate conductors 211 and 212.

The second capacitor C2 (see FIG. 1) includes the flat plate conductors 211 and 213 that are provided respectively on the insulator layers 106 and 107, and the insulator layer 106 interposed between the flat plate conductors 211 and 213.

The insulator layer 109 is arranged to underlie the insulator layer 108 in an adjacent relationship. A flat plate conductor 216 is provided on a top surface of the insulator layer 109 (i.e., on a surface thereof on the side adjacent to the insulator layer 108).

The flat plate conductor 216 is arranged to oppose each of the flat plate conductors 214 and 215 with a predetermined area.

The capacitor C3 (see FIG. 1) includes the flat plate conductors 214, 215 and 216 provided on the insulator layers 108 and 109, and the insulator layer 108 interposed between the flat plate conductors 214, 215 and 216.

The insulator layer 110 is arranged to underlie the insulator layer 109 in an adjacent relationship, and defines a lowermost layer of the laminate 100. The first terminal conductor 111, the second terminal conductor 112, the first ground conductor 113, and the second ground conductor 114 are provided on the insulator layer 110.

Figure 3A:
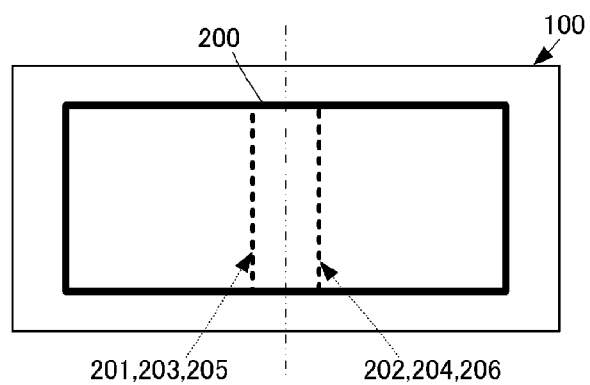
FIGS. 3A and 3B are a seeing-through plan view and a partial side view, respectively, illustrating a positional relationship between a ring conductor pattern and each of linear conductor patterns of a first inductor and linear conductor patterns of a second inductor.
Figure 3B:
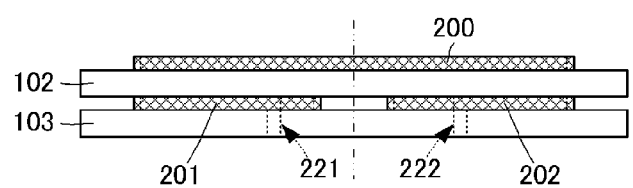

In the structure described above, the ring conductor pattern 200, the linear conductor patterns 201, 203 and 205 of the first inductor L1, and the linear conductor patterns 202, 204 and 205 of the second inductor L2 are preferably arranged in the following structural relationship. FIG. 3A is a seeing-through plan view illustrating a positional relationship between the ring conductor pattern 200 and each of the linear conductor patterns 201, 203 and 205 of the first inductor L1 and the linear conductor patterns 202, 204 and 206 of the second inductor L2. FIG. 3B is a partial side view illustrating a positional relationship between the ring conductor pattern 200 and each of the linear conductor pattern 201 of the first inductor L1 and the linear conductor pattern 202 of the second inductor L2.

As illustrated in FIGS. 3A and 3B, the ring conductor pattern 200 is arranged to overlap or substantially overlap with the linear conductor patterns 201, 203 and 205 and the linear conductor patterns 202, 204 and 206. In other words, the ring conductor pattern 200 is arranged such that an inner region surrounded by the ring conductor pattern 200 includes the inner regions (corresponding to the air space portion of the first inductor L1) surrounded by the linear conductor patterns 201, 203 and 205, and also includes the inner regions (corresponding to the air space portion of the second inductor L2) surrounded by the linear conductor patterns 202, 204 and 206.

With the structure described above, the first inductor L1 and the second inductor L2 are directly magnetically coupled with each other through the helical shape including the linear conductor patterns 201, 203 and 205 and the helical shape including the linear conductor patterns 202, 204 and 206. As a result, the above-described mutual inductance M0 is realized.

Furthermore, the ring conductor pattern 200 is coupled with a magnetic field generated by the first inductor L1, and the second inductor L2 is coupled with a magnetic field that is in turn induced by the ring conductor pattern 200. Stated another way, the first inductor L1 and the second inductor L2 are magnetically coupled with each other through the ring conductor pattern 200. As a result, the above-described mutual inductances M1 and M2 are achieved.

With the arrangement described above, the indirect mutual inductances M1 and M2 can be changed by changing a position of the ring conductor pattern 200 relative to each of the linear conductor patterns 201, 203 and 205 and the linear conductor patterns 202, 204 and 206 in the first direction or the second direction. Thus, it is possible to change a degree of magnetic coupling (M coupling) between the first inductor L1 and the second inductor L2 and to change the filter characteristic without changing the thickness of the laminate 100.

Figure 4:
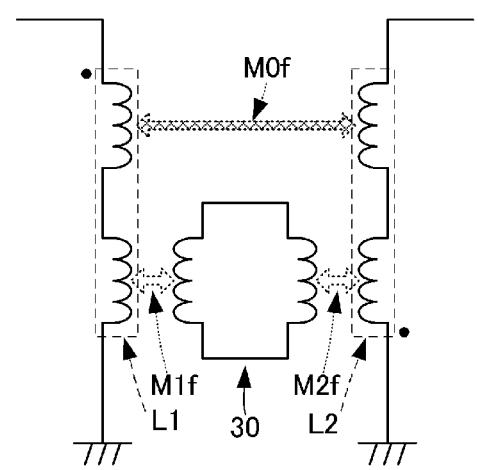
FIG. 4 is an equivalent circuit diagram of the filter element according to the first preferred embodiment of the present invention in the case of in-phase coupling.

In the arrangement described above, for example, a winding direction of the first inductor L1 and a winding direction of the second inductor L2 are preferably opposite to each other in a state when viewing the laminate 100 in a plan view. In such a case, as illustrated in FIG. 4, the first inductor L1 and the second inductor L2 are brought into in-phase magnetic coupling. FIG. 4 is an equivalent circuit diagram of the filter element in the case of in-phase coupling. In that case, between the first inductor L1 and the second inductor L2, a mutual inductance M0$f$ is generated due to direct magnetic coupling, and mutual inductances M1$f$ and M2$f$ are generated through the ring conductor pattern 200.

When the position of the ring conductor pattern 200 is changed, the mutual inductance M0$f$ is not changed, but the mutual inductances M1$f$ and M2$f$ are changed. Accordingly, the filter characteristic can be effectively adjusted.

Figure 5:
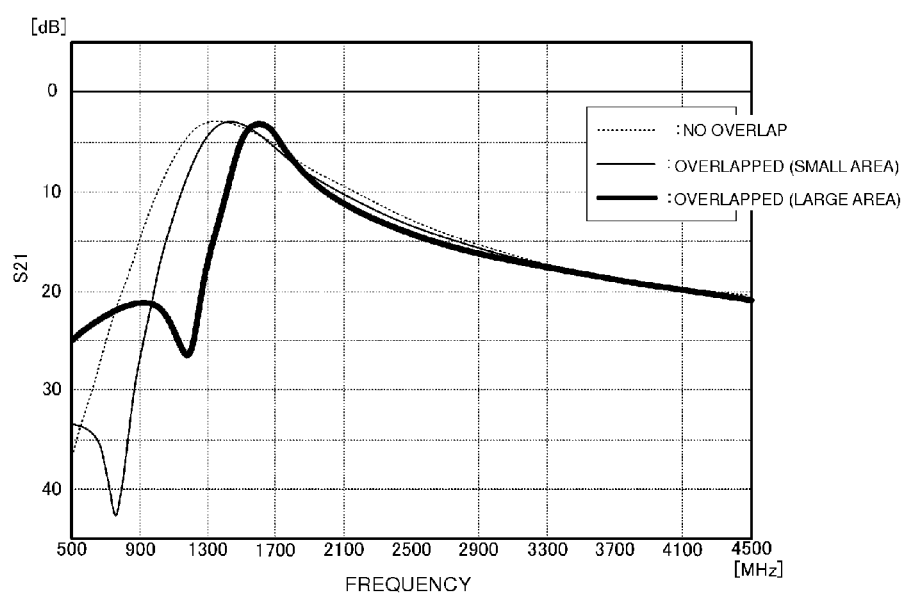
FIG. 5 is a graph plotting a filter characteristic when a position of the ring conductor pattern is changed in the case of in-phase coupling.

FIG. 5 is a graph plotting the filter characteristic when the position of the ring conductor pattern 200 is changed in the case of in-phase coupling. FIG. 5 plots a transmission characteristic (S21) between the first input/output terminal P1 and the second input/output terminal P2. A dotted line represents the case in which the ring conductor pattern 200 is not provided. A thin solid line represents the case in which an overlapping area of the ring conductor pattern 200 with respect to the linear conductor patterns 201, 203 and 205 of the first inductor L1 and the linear conductor patterns 202, 204 and 206 of the second inductor L2 is relatively small. A thick solid line represents the case in which the overlapping area of the ring conductor pattern 200 with respect to the linear conductor patterns 201, 203 and 205 of the first inductor L1 and the linear conductor patterns 202, 204 and 206 of the second inductor L2 is relatively large.

As seen from FIG. 5, a pass band width can be changed by changing the above-mentioned overlapping area. At the same time, a position of attenuation pole frequency can also be changed.

Figure 6:
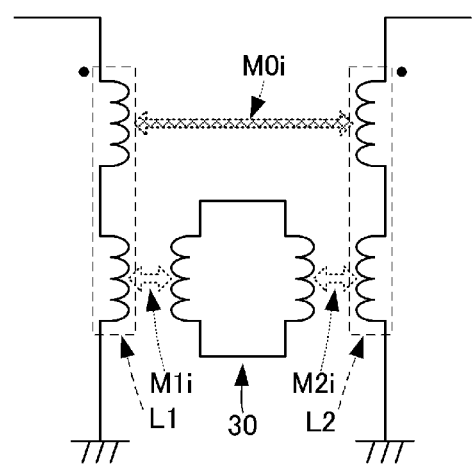
FIG. 6 is an equivalent circuit diagram of the filter element according to the first preferred embodiment of the present invention in the case of opposite-phase coupling.

Another case will be described in which, unlike the above-described arrangement, the winding direction of the first inductor L1 and the winding direction of the second inductor L2 are the same in a state when viewing the laminate 100 in a plan view. In such a case, as illustrated in FIG. 6, the first inductor L1 and the second inductor L2 are brought into opposite-phase magnetic coupling. FIG. 6 is an equivalent circuit diagram of the filter element in the case of opposite-phase coupling. In that case, between the first inductor L1 and the second inductor L2, a mutual inductance M0$i$ is generated due to direct magnetic coupling, and mutual inductances M1$i$ and M2$i$ are generated through the ring conductor pattern 200.

When the position of the ring conductor pattern 200 is changed, the mutual inductance M0$i$ is not changed, but the mutual inductances M1$i$ and M2$i$ are changed. Accordingly, the filter characteristic can be effectively adjusted.

Figure 7:
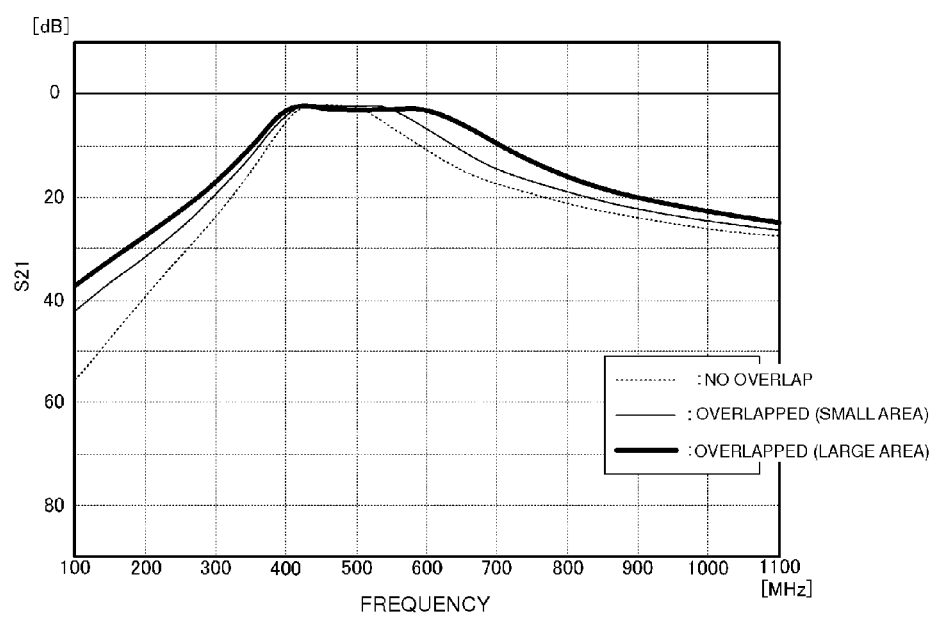
FIG. 7 is a graph plotting a filter characteristic when a position of the ring conductor pattern is changed in the case of opposite-phase coupling.

FIG. 7 is a graph plotting the filter characteristic when the position of the ring conductor pattern 200 is changed in the case of opposite-phase coupling. FIG. 7 plots a transmission characteristic (S21) between the first input/output terminal P1 and the second input/output terminal P2. A dotted line represents the case in which the ring conductor pattern 200 is not provided. A thin solid line represents the case in which an overlapping area of the ring conductor pattern 200 with respect to the linear conductor patterns 201, 203 and 205 of the first inductor L1 and the linear conductor patterns 202, 204 and 206 of the second inductor L2 is relatively small. A thick solid line represents the case in which the overlapping area of the ring conductor pattern 200 with respect to the linear conductor patterns 201, 203 and 205 of the first inductor L1 and the linear conductor patterns 202, 204 and 206 of the second inductor L2 is relatively large. It is to be noted that an attenuation pole is not illustrated in FIG. 7, but it exists in a frequency band not illustrated.

As seen from FIG. 7, a pass band and a pass band width can be changed by changing the above-mentioned overlapped area. In addition, a position of attenuation pole frequency can also be changed.

Thus, with the arrangement of the present preferred embodiment, the filter characteristic can be adjusted merely by adjusting the positional relationship between the ring conductor pattern 200 and each of the linear conductor patterns 201, 203 and 205 of the first inductor L1 and the linear conductor patterns 202, 204 and 206 of the second inductor L2. As a result, a degree of flexibility in design of the filter is increased without being affected by dimensional limitations of the laminate. Additionally, if there is an allowance for the dimensions of the laminate, the filter characteristic can also be adjusted by adjusting the spaces (distances) from the ring conductor pattern 200 to the linear conductor patterns 201, 203 and 205 of the first inductor L1 and the linear conductor patterns 202, 204 and 206 of the second inductor L2.

When relative positions of the ring conductor pattern 200 and each of the linear conductor patterns 201, 203 and 205 of the first inductor L1 and the linear conductor patterns 202, 204 and 206 of the second inductor L2 are shifted in a plan view of the laminate 100, it is preferable, from the standpoint of obtaining sharper attenuation characteristics, to configure the ring conductor pattern 200 such that the respective inner regions surrounded by the linear conductor patterns 201, 203 and 205 of the first inductor L1 and the linear conductor patterns 202, 204 and 206 of the second inductor L2 are included within the inner region surrounded by the ring conductor pattern 200.

Figure 8:
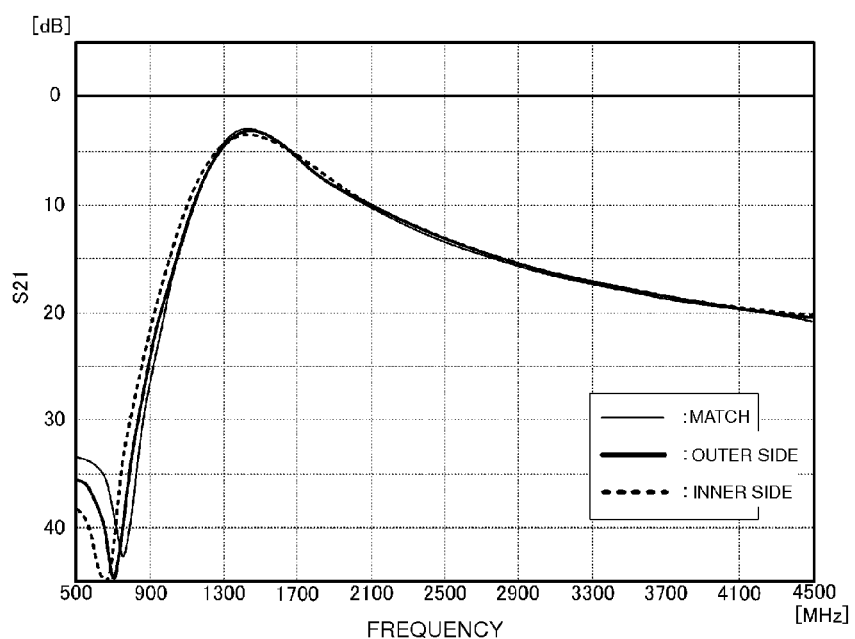
FIG. 8 is a graph plotting changed of the filter characteristic depending on the positional relationship between the ring conductor pattern and each of the linear conductor patterns of the first inductor and the linear conductor patterns of the second inductor.

FIG. 8 is a graph plotting the change of the filter characteristic depending on the positional relationship between the ring conductor pattern 200 and each of the linear conductor patterns 201, 203 and 205 of the first inductor L1 and the linear conductor patterns 202, 204 and 206 of the second inductor L2. In FIG. 8, a thin solid line represents the case in which the ring conductor pattern 200 is arranged to match or substantially match with the linear conductor patterns 201, 203 and 205 of the first inductor L1 and the linear conductor patterns 202, 204 and 206 of the second inductor L2, as illustrated in FIGS. 3A and 3B, when viewing the laminate 100 in a plan view. A thick dotted line represents the case in which the ring conductor pattern 200 is arranged substantially within the respective inner regions surrounded by the linear conductor patterns 201, 203 and 205 of the first inductor L1 and the linear conductor patterns 202, 204 and 206 of the second inductor L2 when looking at the laminate 100 in a plan view. A thick solid line represents the case in which the respective inner regions surrounded by the linear conductor patterns 201, 203 and 205 of the first inductor L1 and the linear conductor patterns 202, 204 and 206 of the second inductor L2 are included within the inner region surrounded by the ring conductor pattern 200 when looking at the laminate 100 in a plan view. As seen from FIG. 8, sharper attenuation characteristics are achieved in the lower frequency side of the pass band by arranging the ring conductor pattern 200 in a shape including the respective regions of the linear conductor patterns 201, 203 and 205 of the first inductor L1 and the linear conductor patterns 202, 204 and 206 of the second inductor L2, rather than a shape in which the ring conductor pattern 200 is positioned within the respective regions of the linear conductor patterns 201, 203 and 205 of the first inductor L1 and the linear conductor patterns 202, 204 and 206 of the second inductor L2.

Furthermore, the above-described positional relationship between the ring conductor pattern 200 and each of the linear conductor patterns 201, 203 and 205 of the first inductor L1 and the linear conductor patterns 202, 204 and 206 of the second inductor L2 is preferably set on the condition that the ring conductor pattern 200 satisfies the following requirements.

Here, the ring conductor pattern 200 is divided, when viewing the laminate 100 in a plan view, into a first open ring-shaped portion (C-shaped conductor portion) on the side closer to the first inductor L1, a second open ring-shaped portion (C-shaped conductor portion) on the side closer to the second inductor L2, and a conductor portion interconnecting those two open ring-shaped portions. An imaginary plane (see a two-dot-chain line in FIGS. 3A and 3B) perpendicular or substantially perpendicular to the flat plate surface of the insulator layer 102 is set such that the air space portion (inner region) of the first inductor L1 and the air space portion (inner region) of the second inductor L2 are surface-symmetric with respect to the imaginary plane. The ring conductor pattern 200 is then divided to be surface-symmetric with respect to the imaginary plane. Moreover, when viewing the laminate 100 in a plan view, it is preferable that respective centers of the linear conductor patterns 201, 203 and 205, i.e., the center axis of the first inductor L1, and a center of the first open ring-shaped portion are aligned or substantially aligned with each other, and that respective centers of the linear conductor patterns 202, 204 and 206, i.e., the center axis of the second inductor L2, and a center of the second open ring-shaped portion are aligned or substantially aligned with each other. With such an arrangement, the ring conductor pattern 200 is strongly magnetically coupled with the first inductor L1 and the second inductor L2. As a result, a sharper filter characteristic is more easily obtained.

Figure 9A:
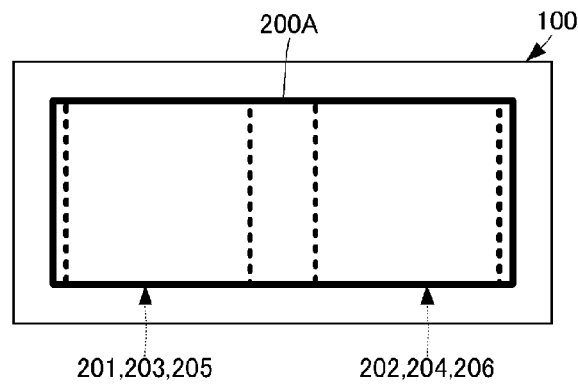
FIGS. 9A, 9B, and 9C are each a seeing-through plan view illustrating a positional relationship between a different ring conductor pattern and each of the linear conductor patterns of the first inductor and the linear conductor patterns of the second inductor.
Figure 9B:
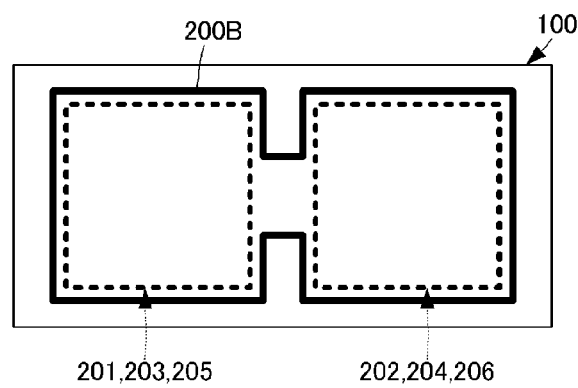
Figure 9C:
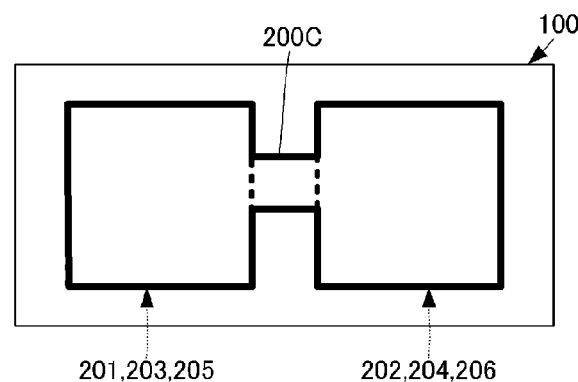

In the description above, the ring conductor pattern 200 preferably has a rectangular or substantially rectangular shape, when viewing the laminate 100 in a plan view, that the ring conductor pattern 200 surrounds the linear conductor patterns 201, 203 and 205 of the first inductor L1 and the linear conductor patterns 202, 204 and 206 of the second inductor L2 together, and that it overlaps with the linear conductor patterns 201, 203 and 205 and the linear conductor patterns 202, 204 and 206. However, the ring conductor pattern 200 may have different shapes and configurations as illustrated in FIGS. 9A, 9B and 9C. Variations of the filter characteristic can be increased by using the different shapes and configurations shown in FIGS. 9A, 9B, and 9C.

FIG. 9A is a seeing-through plan view illustrating a positional relationship between a ring conductor pattern 200A and each of the linear conductor patterns 201, 203 and 205 of the first inductor L1 and the linear conductor patterns 202, 204 and 206 of the second inductor L2. FIG. 9B is a seeing-through plan view illustrating a positional relationship between a ring conductor pattern 200B and each of the linear conductor patterns 201, 203 and 205 of the first inductor L1 and the linear conductor patterns 202, 204 and 206 of the second inductor L2. FIG. 9C is a seeing-through plan view illustrating a positional relationship between a ring conductor pattern 200C and each of the linear conductor patterns 201, 203 and 205 of the first inductor L1 and the linear conductor patterns 202, 204 and 206 of the second inductor L2.

In the ring conductor pattern 200A illustrated in FIG. 9A, only portions extending in the first direction are aligned with corresponding respective portions of the linear conductor patterns 201, 203 and 205 and the linear conductor patterns 202, 204 and 206. In the case of FIG. 9A, the degree of magnetic coupling between the ring conductor pattern 200A and both of the first inductor L1 and the second inductor L2 can be reduced as compared to that obtained with the shape shown in FIGS. 3A and 3B.

The ring conductor pattern 200B illustrated in FIG. 9B has a shape extending along respective outer peripheries of the linear conductor patterns 201, 203 and 205 and the linear conductor patterns 202, 204 and 206, and it is disposed outwardly of those outer peripheries by a predetermined distance. In the case of FIG. 9B, a length of the ring conductor pattern 200B can be adjusted while the degree of magnetic coupling between the ring conductor pattern 200B and both of the first inductor L1 and the second inductor L2 is maintained at a predetermined value.

The ring conductor pattern 200C illustrated in FIG. 9C is configured such that it not only partially extends along a rectangular or substantially rectangular shape surrounding the linear conductor patterns 201, 203 and 205 and the linear conductor patterns 202, 204 and 206 together, but also partially extends along respective portions of the linear conductor patterns 201, 203 and 205 and the linear conductor patterns 202, 204 and 206, those portions being positioned close to each other. In the case of FIG. 9C, the degree of magnetic coupling between the ring conductor pattern 200C and both of the first inductor L1 and the second inductor L2 can be increased as compared to those obtained with the shapes shown in FIGS. 3A and 3B.

It is to be noted that FIGS. 9A, 9B and 9C merely illustrate several examples of the shape and configuration of the ring conductor pattern, and that the illustrated shapes and configurations may be combined with each other. Stated in another way, the ring conductor pattern may have other suitable shapes and configurations as long as at least a portion of the air space portion of the first inductor L1 and at least a portion of the air space portion of the second inductor L2 are included in the inner region of the ring conductor pattern.

For example, in the ring conductor pattern 200 illustrated in FIG. 2, a portion of the ring conductor pattern 200 overlapping with the linear conductor patterns 201, 203 and 205 of the first inductor L1 and a portion of the ring conductor pattern 200 overlapping with the linear conductor patterns 202, 204 and 206 of the second inductor L2 may be provided in different insulator layers, respectively, and those portions may be connected to each other through a via conductor. In such a case, a spacing between the first inductor L1 and a portion of the ring resonator 30 opposed to the first inductor L1 and a spacing between the second inductor L2 and a portion of the ring resonator 30 opposed to the second inductor L2 can be set to be different from each other. As a result, the coupling between the ring resonator 30 and the first inductor L1 and the coupling between the ring resonator 30 and the second inductor L2 can be adjusted separately.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter element comprising:
   a laminate including a plurality of insulator layers that are laminated on each other, the laminate including a first inductor and a second inductor therein; wherein
   each of the first inductor and the second inductor is defined by loop-shaped conductor patterns provided between common adjacent pairs of the plurality of insulator layers, and by via conductors penetrating through the common adjacent pairs of the plurality of insulator layers and connecting the respective loop-shaped conductor patterns to each other in a laminating direction of the laminate;
   each of the first inductor and the second inductor has a helical shape and includes an air space portion with a center axis extending in the laminating direction;
   the first inductor and the second inductor are disposed at different positions of the laminate when viewed in the laminating direction;
   a ring conductor pattern including an opening is provided on an insulator layer of the plurality of insulator layers different from the insulator layers of the plurality of insulator layers on which the first inductor and the second inductor are provided;
   at least a portion of the air space portion of the first inductor and at least a portion of the air space portion of the second inductor are arranged inside the ring conductor pattern when viewed in the laminating direction; and
   the ring conductor pattern defines a ring resonator which is not electrically connected to any input/output terminals, any of the loop-shaped conductor patterns of the first and second inductors, or any other conductor patterns.

2. The filter element according to claim 1, wherein the ring conductor pattern is arranged such that the air space portion of the first inductor and the air space portion of the second inductor are arranged inside the opening of the ring conductor pattern when viewed in the laminating direction.

3. The filter element according to claim 1, wherein the ring conductor pattern is arranged to overlap with at least a portion of the loop-shaped conductor patterns of the first inductor and with at least a portion of the loop-shaped conductor patterns of the second inductor when viewed in the laminating direction.

4. The filter element according to claim 1, wherein the ring conductor pattern is arranged to extend in an overlapping relationship along at least a portion of one of the loop-shaped conductor patterns of the first inductor positioned closest to the ring conductor pattern, and along at least a portion of one of the loop-shaped conductor patterns of the second inductor positioned closest to the ring conductor pattern, when viewed in the laminating direction.

5. The filter element according to claim 4, wherein
   the ring conductor pattern includes a first open ring-shaped portion and a second open ring-shaped portion that are surface-symmetric with respect to an imaginary plane, the imaginary plane being perpendicular or substantially perpendicular to a flat plate surface of the insulator layer thereof and being set such that the air space portion of the first inductor and the air space portion of the second inductor are surface-symmetric with respect to the imaginary plane; and
   the ring conductor pattern is arranged such that, when viewed in the laminating direction, the center axis of the air space portion of the first inductor and a center of the first open ring-shaped portion are aligned or substantially aligned with each other, and the center axis of the air space portion of the second inductor and a center of the second open ring-shaped portion are aligned or substantially aligned with each other.

6. The filter element according to claim 1, wherein the ring conductor pattern has a length equal or substantially equal to a wavelength of a desired attenuation pole frequency of the filter element.

7. The filter element according to claim 1, wherein the ring conductor pattern is not connected to a ground.

8. The filter element according to claim 1, further comprising:
   a first capacitor including a set of first flat plate conductors opposed to each other with a predetermined area, the first flat plate conductors being provided on insulator layers of the plurality of insulator layers different from the insulator layers on which the loop-shaped conductor patterns of the first inductor, the loop-shaped conductor patterns of the second inductor, and the ring conductor pattern are provided; and
   a second capacitor includes a set of second flat plate conductors opposed to each other with a predetermined area, the second flat plate conductors being provided on insulator layers of the plurality of insulator layers different from the insulator layers on which the loop-shaped conductor patterns of the first inductor, the loop-shaped conductor patterns of the second inductor, and the ring conductor pattern are provided; wherein
   the first inductor and the first capacitor define a first parallel resonator; and
   the second inductor and the second capacitor define a second parallel resonator.

9. The filter element according to claim 8, wherein the first parallel resonator and the second parallel resonator are arranged to be magnetically coupled to each other.

10. The filter element according to claim 8, wherein the ring conductor pattern is arranged to be magnetically coupled to each of the first and second inductors.

11. A filter element comprising:
    a first inductor;
    a second inductor; and
    a ring conductor pattern; wherein
    each of the first inductor and the second inductor is defined by loop-shaped conductor patterns;
    each of the first inductor and the second inductor has a helical shape and includes an air space portion with a center axis extending through a center of the helical shape, the center axes of the airspace portions of the first and second inductors being parallel or substantially parallel to each other;

the first inductor and the second inductor are spaced apart from each other in a direction perpendicular or substantially perpendicular to a direction in which the center axes of the air space portions of the first and second inductors extend;

a ring conductor pattern including an opening is provided adjacent to the first inductor and the second inductor in the direction in which the center axes of the air space portions of the first and second inductors extend;

at least a portion of the air space portion of the first inductor and at least a portion of the air space portion of the second inductor are arranged inside the ring conductor pattern when viewed in the direction in which the center axes of the air space portions of the first and second inductors extend; and the ring conductor pattern defines a ring resonator which is not electrically connected to any input/output terminal, any of the loop-shaped conductor patterns of the first and second inductors, or any other conductor patterns.

12. The filter element according to claim 11, wherein the ring conductor pattern is arranged such that the air space portion of the first inductor and the air space portion of the second inductor are arranged inside the opening of the ring conductor pattern when viewed in the direction in which the center axes of the air space portions of the first and second inductors extend.

13. The filter element according to claim 11, wherein the ring conductor pattern is arranged to overlap with at least a portion of the loop-shaped conductor patterns of the first inductor and with at least a portion of the loop-shaped conductor patterns of the second inductor when viewed in the direction in which the center axes of the air space portions of the first and second inductors extend.

14. The filter element according to claim 11, wherein the ring conductor pattern is arranged to extend in an overlapping relationship along at least a portion of one of the loop-shaped conductor patterns of the first inductor positioned closest to the ring conductor pattern, and along at least a portion of one of the loop-shaped conductor patterns of the second inductor positioned closest to the ring conductor pattern, when viewed in the direction in which the center axes of the air space portions of the first and second inductors extend.

15. The filter element according to claim 14, wherein
the ring conductor pattern includes a first open ring-shaped portion and a second open ring-shaped portion that are surface-symmetric with respect to an imaginary plane, the imaginary plane being perpendicular or substantially perpendicular to the direction in which the center axes of the first and second inductors extend and being set such that the air space portion of the first inductor and the air space portion of the second inductor are surface-symmetric with respect to the imaginary plane; and the ring conductor pattern is arranged such that, when viewed in the direction in which the center axes of the air space portions of the first and second inductors extend, the center axis of the air space portion of the first inductor and a center of the first open ring-shaped portion are aligned or substantially aligned with each other, and the center axis of the air space portion of the second inductor and a center of the second open ring-shaped portion are aligned or substantially aligned with each other.

16. The filter element according to claim 11, wherein the ring conductor pattern has a length equal or substantially equal to a wavelength of a desired attenuation pole frequency of the filter element.

17. The filter element according to claim 11, wherein the ring conductor pattern is not connected to a ground.

18. The filter element according to claim 11, further comprising:

a first capacitor including a set of first flat plate conductors opposed to each other with a predetermined area and at least one insulating layer therebetween, the first flat plate conductors being spaced apart from the first and second inductors and the ring conductor pattern in the direction in which the center axes of the air space portions of the first and second inductors extend; and a second capacitor includes a set of second flat plate conductors opposed to each other with a predetermined area and at least one insulating layer therebetween, the second flat plate conductors being spaced apart from the first and second inductors and the ring conductor pattern in the direction in which the center axes of the air space portions of the first and second inductors extend; wherein the first inductor and the first capacitor define a first parallel resonator; and the second inductor and the second capacitor define a second parallel resonator.

19. The filter element according to claim 18, wherein the first parallel resonator and the second parallel resonator are arranged to be magnetically coupled to each other.

20. The filter element according to claim 18, wherein the ring resonator is arranged to be magnetically coupled to each of the first and second inductors.

* * * * *